United States Patent
Al Ahmad

(10) Patent No.: US 12,163,988 B2
(45) Date of Patent: Dec. 10, 2024

(54) SYSTEM AND METHOD FOR EXTRACTION OF PIEZOELECTRIC CONSTANTS ELECTRICALLY

(71) Applicant: United Arab Emirates University, Al Ain (AE)

(72) Inventor: Mahmoud F. Y. Al Ahmad, Al Ain (AE)

(73) Assignee: United Arab Emirates University, Al Ain (AE)

( * ) Notice: Subject to any disclaimer, the term of this patent is extended or adjusted under 35 U.S.C. 154(b) by 0 days.

(21) Appl. No.: 17/360,753

(22) Filed: Jun. 28, 2021

(65) Prior Publication Data

US 2021/0349137 A1    Nov. 11, 2021
US 2022/0163577 A9    May 26, 2022

Related U.S. Application Data

(63) Continuation-in-part of application No. 16/674,515, filed on Nov. 5, 2019, now abandoned.
(Continued)

(51) Int. Cl.
*G01R 27/26*      (2006.01)
*H10N 30/00*      (2023.01)
(Continued)

(52) U.S. Cl.
CPC ....... *G01R 27/2605* (2013.01); *H10N 30/045* (2023.02); *H10N 30/05* (2023.02);
(Continued)

(58) Field of Classification Search
None
See application file for complete search history.

(56) References Cited

U.S. PATENT DOCUMENTS 5,915,267 A    6/1999   Kim
6,047,600 A    4/2000   Ottosson et al.
(Continued)

OTHER PUBLICATIONS

Mahmoud Al Ahmad et al.; A Capacitance-Based Methodology for the Estimation of Piezoelectric Coefficients of Poled Piezoelectric Materials; Department of Materials Science and Engineering, King Abdullah University of Science and Technology; G108-G110; Published Oct. 4, 2010. (Year: 2010).*
(Continued)

*Primary Examiner* — Nasima Monsur
(74) *Attorney, Agent, or Firm* — Boyle Fredrickson, S.C.

(57) ABSTRACT

Activity of piezoelectric material dimension and electrical properties can be changed with an applied stress. These variations are translated to a change in capacitance of the structure. Use of capacitance-voltage measurements for the extraction of double piezoelectric thin film material deposited at the two faces of a flexible steel sheet is described. Piezoelectric thin film materials are deposited using RF sputtering techniques. Gamry analyzer references 3000 is used to collect the capacitance-voltage measurements from both layers. A developed algorithm extracts directly the piezoelectric coefficients knowing film thickness, applied voltage, and capacitance ratio. The capacitance ratio is the ratio between the capacitances of the film when the applied field in antiparallel and parallel to the poling field direction, respectively. Piezoelectric bulk ceramic is used for calibration and validation by comparing the result with the reported values from literature. Extracted values using the current approach match well values extracted by existing methods.

8 Claims, 5 Drawing Sheets

Related U.S. Application Data

(60) Provisional application No. 62/755,770, filed on Nov. 5, 2018.

(51) Int. Cl.
 *H10N 30/045* (2023.01)
 *H10N 30/05* (2023.01)
 *H10N 30/079* (2023.01)
 *H10N 30/20* (2023.01)
 *H10N 30/50* (2023.01)

(52) U.S. Cl.
 CPC ......... *H10N 30/079* (2023.02); *H10N 30/206* (2023.02); *H10N 30/50* (2023.02); *H10N 30/708* (2024.05)

(56) References Cited

U.S. PATENT DOCUMENTS

| | | | | |
|---|---|---|---|---|
| 2007/0024162 | A1* | 2/2007 | Shibata | H10N 30/1051 310/358 |
| 2009/0007645 | A1* | 1/2009 | Shih | G01Q 60/38 29/25.35 |
| 2010/0320868 | A1* | 12/2010 | Kushnir | H02N 2/062 310/317 |

OTHER PUBLICATIONS

Kim Dong Guk [KR] et al.; Measuring Method For Piezoelectric Characterization of Thin Film Type Materials and Apparatus the Same; Date Published Jan. 31, 2004; Korea Advanced Inst Sci & Tech [KR]; KR 100416397 B1; (KR) (Year: 2004).*

Mahmoud Al Ahmad, A Capacitance-Based Methodology for the Estimation of Piezoelectric Coefficients of Poled Piezoelectric Materials, Electrochemical and Solid State Letters, 13 (12), G108-G110 (Sep. 2010).

Mahmoud Al Ahmad, Piezoelectric Coefficients of Thin Film Aluminum Nitride Characterizations Using Capacitance Measurements, IEEE Microwave and Wireless Components Letters, vol. 19, No. 3, 140-142 (Mar. 2019).

Tom vanHemert, Sincy Jose, Raymond J.E. Hueting, and Jurriaan Schmitz, Exploring Capacitance-Voltage Measurements to fine the Piezoelectric Coefficient of Aluminum Nitride, IEEE Conference on Microelectronic Test Structures, 69-73 (Apr. 2011).

Meng Zhang, Jian Yang, Chaowei Si, Guowei Han, Yongmei Zhao, and Jin Ning, Research on the Piezoelectric Properties of AlN Thins Films for MEMS Applications, Micromachines, 1236-1248 (Sep. 2015).

Nathan Jackson, Oskar Z. Olszewski, Lynette Keeney, Alan Blake, and Alan Mathewson, A Capacitive based Piezoelectric AlN Film Quality Test Structure, Tyndall National Institute, 193-197 (May 2015).

* cited by examiner

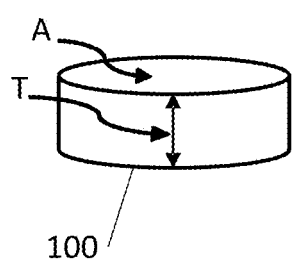
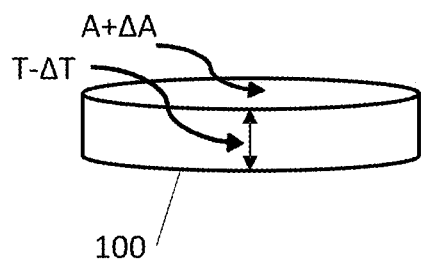
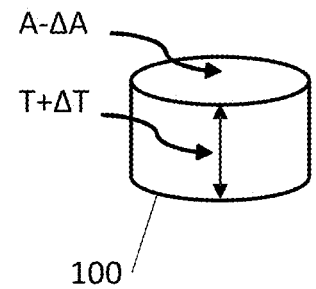
FIG 1A  FIG 1B  FIG 1C
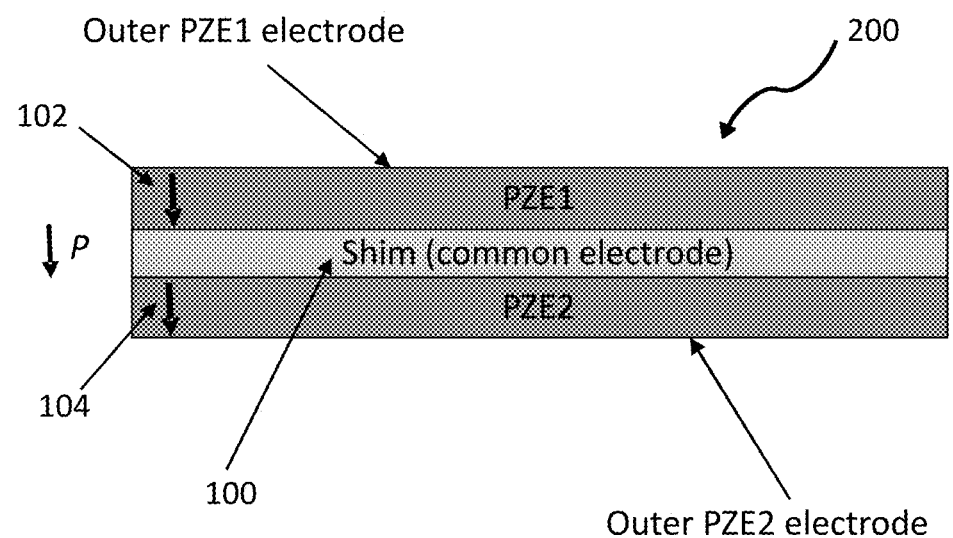
FIG 2

SYSTEM AND METHOD FOR EXTRACTION OF PIEZOELECTRIC CONSTANTS ELECTRICALLY

CROSS-REFERENCE AND RELATED APPLICATIONS

This application is a Continuation-in-Part application from U.S. application Ser. No. 16/674,515, filed on Nov. 5, 2019, which claims the benefit of U.S. Provisional Application No. 62/755,770, filed on Nov. 5, 2018, all of which are incorporated herein by reference in their entirety.

FIELD OF THE INVENTION

This invention relates generally to a method for extraction of piezoelectric constants and more specifically, to a new piezoelectric structure that allows for extraction of piezoelectric coefficients by a new technique using a Capacitance-Voltage (CV) method.

BACKGROUND

Piezoelectric materials own special characteristics and properties that make them an excellent candidate to be utilized in advanced sensing fields. Such materials have been integrated and incorporated within highly adaptive smart structures. Flexible piezoelectric thin films have been implemented in biomedical applications due to their advantages of having highly piezoelectric constants, lightweight, slim, and biocompatible properties. Lead zirconate titanate (PZT) is a common piezoelectric material that is used for piezoelectric sensors and actuators. On the other hand, the monolithic integrated PZT wavers or patches, including ceramic materials, have poor fatigue resistance and are very fragile. That limits their ability to adapt to curved surfaces and makes them vulnerable to breakage accidentally through the bonding and handling procedures. This, in turn, affects the sensitivity of the sensor or actuator devices. The thin film technology finds further applications in such complicated conditions and curved surfaces. To overcome these issues, PZT was deposited on flexible sheets. The piezoelectric thin films on flexible sheets respond to nanoscale biomechanical vibrations caused by acoustic waves and tiny movements on corrugated surfaces of internal organs. Furthermore, it is used for developing self-powered energy harvesters, as well as sensitive nano-sensors for diagnostic systems. Flexible sheets of PZT material are naturally tough and pliable unlike the traditional piezoelectric patches. Xu et al. have developed a piezoelectric tape that is composed of patterned packed PZT elements sandwiched between two flexible metallic films. The PZT elements can have various distribution densities and shapes. They can be grouped or addressed individually. This phased array piezoelectric tape has good conformability to curved surfaces which makes it suitable to be used in different mechanical structures.

A thorough knowledge of material characteristics, including the piezoelectric coefficients and the electromechanical coupling factors is necessary for using the piezoelectric thin films in micromechanical systems (MMES). Uskoković et al. has compared the resulting piezoelectric coefficient values with other materials in other researches. Jackson et al. compared capacitance-voltage (CV) method, laser doppler vibrometer (LDV), Berlincourt, and piezoelectric force microscopy (PFM) method to find piezoelectric properties of aluminum nitride (AlN). They concluded that LDV and PFM are the most accurate. In contrast, they reported that the CV method would be the easiest and quickest method to use. Hemert et al. elaborated on the capacitance-voltage measurements and proposed a bias independent capacitance model as an alternative. They extracted with their proposed model the piezoelectric coefficient $d_{33}$ and the dielectric constant for permittivity k, then verified the results at various biased electrodes thicknesses. They have used bulk acoustic wave (BAW) resonator model as a bias dependent capacitance model for piezoelectric capacitors. Using this model, the piezoelectric coefficient $d_{33}$ and dielectric constant were extracted from CV recording for three different layers thicknesses. On the other hand, Hemert et al. criticized the CV method in other research as they concluded that the permittivity is not constant, so the piezoelectric parameters need further information to be determined by the CV measurement such as the resonance measurements. Zhang et al. took AlN properties and studied the coefficients of AlN films by microscopy measurement and finite element method. Zhang et al. criticized the capacitance method due to the effect of interfacial capacitance between PZT films and electrodes as well as its low precision.

In previous research, Al Ahmad et al. have presented a new method of measuring piezoelectric thin film's vertical extension by utilizing the capacitance-voltage (CV) approach. This approach has received attention and several studies had commented and elaborated on its cons and pros. As a summary, many researchers have considered the reported CV method to be the easiest one to use and the one that provides quick results, as it does not require sample preparations as in other competing methods, which makes it cheaper. The development of advanced piezoelectric structures calls for further optimization and enhancement of the current existing methods for characterizing new piezoelectric structures.

SUMMARY

This disclosure describes new structures and methods for extracting piezoelectric coefficients. Some of the methods utilize a new algorithm applied to existing techniques known in the field that uses the C-V method. The newly developed algorithms and techniques described in this disclosure allow for determining the piezoelectric coefficient in a sensing device utilizing piezoelectric material so that such information may be used to obtain necessary parameters to manufacture such sensors for targeted use. Example embodiments of developed piezoelectric structures have been described in this disclosure. Such embodiments include structures that incorporate two piezoelectric layers sandwiching a flexible metallic sheet. Embodiments for obtaining said parameters comprises applying a biasing electrical field over the piezoelectric structure, where the biasing electrical field may have one or more selected directions in relation to a piezoelectric field that is generated when a force is applied on said piezoelectric structure as determined by its poling direction.

Embodiment methods for determining piezoelectric parameters of a piezoelectric structure, comprises applying a biasing electrical field E over the piezoelectric structure, where the biasing electrical field may have one or more selected directions in relation to a poling direction P of said piezoelectric structure; and determining the longitudinal piezoelectric voltage constant $d_{33}$ and transversal piezoelectric voltage constant $d_{31}$ of said piezoelectric structure in relation to a selected parameter ratio.

In further embodiment methods the predetermined parameter ratio is a capacitance ratio $C_r = C_{\downarrow\uparrow}/C_{\uparrow\uparrow}$ based on the quota between a first capacitance $C_{\downarrow\uparrow}$ of the piezoelectric structure due to an applied biasing electrical field with a direction antiparallel to said poling direction and a second capacitance $C_{\uparrow\uparrow}$ of the piezoelectric structure due to an applied biasing electrical field with a direction parallel with said poling direction.

In yet further embodiment methods the relation between the piezoelectric voltage constants $d_{33}$ and $d_{31}$ is determined based on the relation according to the following equation (8) $C_r-2C_rd_{33}E=1+4d_{31}E+2(d_{31}E)^2$. In these embodiment methods the piezoelectric voltage constant $d_{31}$ may be determined based on the relation according to the following equation (11) $d_{31}=(-(C_r+1)+\sqrt{C_r^2++2.5C_r+0.5})E^{-1}$. Further, these embodiments may comprise: applying a said biasing electric field E with a selection of voltage values with negative and positive polarities over the piezoelectric structure; measuring capacitance values for said voltage values; calculating the electric field E and the capacitance ratio Cr based on said capacitance values, said voltage values and a value for the thickness T of a piezoelectric layer of the piezoelectric structure.

Embodiment methods further comprises calibrating the relation between the piezoelectric voltage constant $d_{31}$ and the capacitance ratio Cr by: determining, for an unclamped piezoelectric material used in the piezoelectric structure, a first value for the piezoelectric voltage constant $d_{31}$ with a first method based on the relation according to the following equation (11) $d_{31}=(-(C_r+1)+\sqrt{C_2^2+2.5C_r+0.5})E^{-1}$ and a second value for the piezoelectric voltage constant $d_{31}$ with a second method, for example based on measurement by means of a Berlincourt meter; determining a correction factor Corr for the relation between the piezoelectric voltage constant $d_{31}$ and the capacitance ratio Cr based on the quota between said second value and said first value for the piezoelectric voltage constant $d_{31}$; and applying said correction factor such that piezoelectric voltage constant $d_{31}$ is determined based on the relation according to the following equation (12B) $d_{31}=Corr(-(C_r+1)+\sqrt{C_r^2+2.5C_r+0.5})E^{-1}$.

In embodiments of the method for determining piezoelectric parameters of a piezoelectric structure the piezoelectric voltage constant $d_{33}$ is determined as $d_{33}=xd_{31}$, where an approximation factor x may assume values between 1 and 3, preferably x=2 such that $d_{33}=2d_{31}$.

Further embodiment methods for determining piezoelectric parameters of a piezoelectric structure comprises measuring Cr values for a selection of said applied voltage values; determining the piezoelectric voltage constants $d_{33}$ and $d_{31}$ based on the relation with the capacitance ratio Cr as a function of applied voltage, wherein the applied voltage is expressed in terms of electric field E, according to the following equation (13) $C_r=(1+4d_{31}E+2(d_{31}E)^2)(1-2d_{33}E)^{-1}$ and by fitting the measured values for $C_r$ for specific voltage values using a fitting method, preferably quadratic fitting.

Yet other embodiment methods, comprises: incorporating the piezoelectric structure in a resonator structure having a measurable resonance frequency f and an effective inductor L; driving the resonator against and along polarization/poling directions;

measuring the resonance frequency f for a selection of values for the applied electric field E; determining the piezoelectric voltage constants $d_{33}$ and $d_{31}$ based on the relation with a normalized frequency ratio frn as a function of applied voltage, wherein the applied voltage is expressed in terms of electric field E, according to the following equation (24) $f_{rn}=1+(2d_{31}+d_{33})E+(2d_{31}d_{33}+d_{31}^2)E^2+d_{31}^2d_{33}E^3$ and by fitting values for the normalized frequency ratio frn for specific values for the applied electric field E using a fitting method, preferably cubic equation fitting.

Embodiments include a method of manufacturing a piezoelectric structure that comprises providing a first piezoelectric layer constituting a first outer electrode and a second piezoelectric layer constituting a second outer electrode on a metallic sheet (Shim) constituting a common electrode sandwiched between said first and second electrodes; and poling said first and second piezoelectric layers such that each of said piezoelectric layers has a defined poling direction.

The method of manufacturing a piezoelectric structure may in embodiments, further comprise a selection of:

depositing the first and second piezoelectric layers by a selection of sputtering or spin coating;

coating the metallic sheet with noble materials PLT/Pt/Ti as a seeding layer for the deposition of the piezoelectric thin film materials layers on both faces of the metallic sheet.

In embodiments of the method of manufacturing a piezoelectric structure the metallic sheet is a steel sheet.

In embodiments the poling directions of said first and second piezoelectric layers may have the same direction or opposite directions.

Further embodiments comprise a piezoelectric structure, comprising: a first piezoelectric layer constituting a first outer electrode; a second piezoelectric layer constituting a second outer electrode; and a metallic sheet (Shim) constituting a common electrode sandwiched between said first and second electrodes.

Such embodiments may further comprise a coating on the metallic sheet with noble materials PLT/Pt/Ti forming a seeding layer for the piezoelectric thin film materials layers deposited on both faces of the metallic sheet. The metallic sheet is a steel sheet.

BRIEF DESCRIPTION OF THE DRAWINGS

Embodiments disclosed herein will be further explained with reference to the accompanying drawings, in which:

FIGS. 1A, 1B, and 1C show illustrations of the response of a piezoelectric material in the shape of a disc subjected to an applied electrical field biasing the disk according to different biasing schemes, where FIG. 1A shows an unbiased disk, FIG. 1B shows a disk subjected to an anti-parallel biasing scheme, and FIG. 1C shows a disc subjected to a parallel biasing scheme.

FIG. 2 shows an illustration of double piezoelectric layers (PZE1 and PZE2) sandwiching a metallic sheet (Shim) with poling directions ($\downarrow$P), in accordance with embodiments.

DETAILED DESCRIPTION

Figure 3:
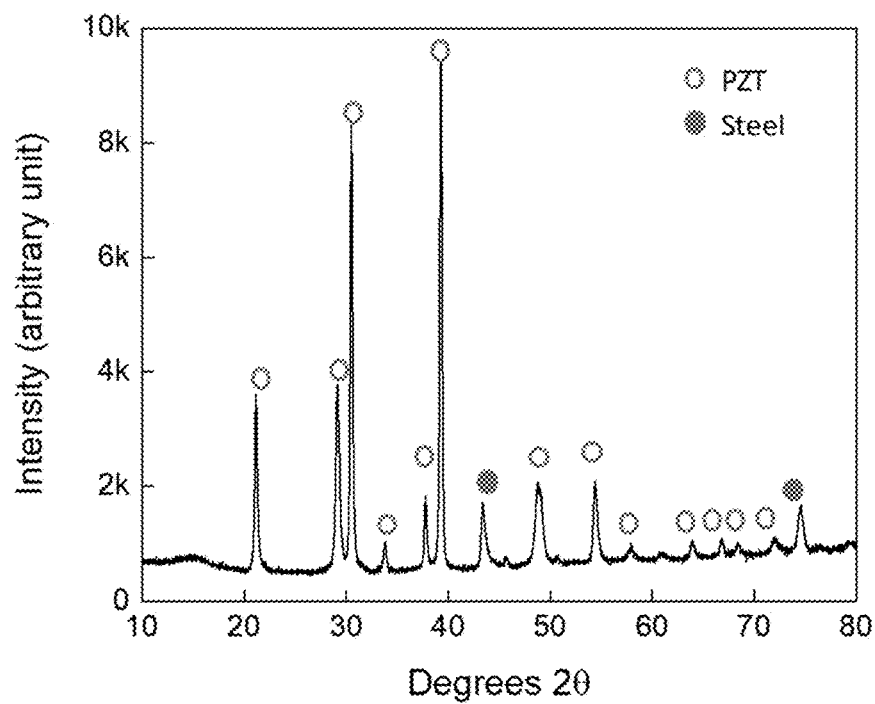
FIG. 3 shows XRD measurements of the fabricated PZT layer to assess the quality of embodiments, for example such embodiments as described in connection with FIG. 2.

This disclosure describes in different embodiments the use of CV characteristics to extract piezoelectric parameters such as the piezoelectric voltage constants utilizing the change in capacitance. Embodiments of a structure comprising two piezoelectric layers and analysis of this structure using embodiments of a developed method are disclosed. The following sections illustrate embodiments of an approach of characterizing the piezoelectric material or structure, the properties of the prepared sample, and of a calibration technique to optimize the characterization algorithm.

Capacitive-Voltage Approach

When a piezoelectric material that is sandwiched between two electrodes is subjected to either mechanical or electrical strains, its geometrical dimensions and dielectric constant will change according to the direction and magnitude of an applied field of mechanical or electric force. FIGS. 1A, 1B, and 1C show illustrations of the response of a piezoelectric material in the shape of a disk subjected to an applied electrical field biasing the disk according to different biasing schemes, where FIG. 1A shows an unbiased disk, FIG. 1B shows a disk subjected to an anti-parallel biasing scheme, and FIG. 1C shows a disc subjected to a parallel biasing schemes.

FIG. 1A thus illustrates a circular disk 100 of a piezoelectric material without applying any type of field exerting a force on the disk, for example neither an electrical nor a mechanical field. The circular disk 100 is shown to have a thickness T and surface area A. FIG. 1B illustrates the situation when disk 100 is driven by or subjected to an applied electrical field (not shown), with a direction opposite to the poling direction, the thickness T decreases and the area A increases simultaneously by an amount $\Delta T$ and $\Delta A$, respectively. This results in an increase in capacitance under such condition. On the other hand, as is illustrated in FIG. 1C, if the applied electric field (not shown) is aligned with the poling direction, the thickness T is shown to increase and the area A is shown to decrease simultaneously by an amount $\Delta T$ and $\Delta A$, respectively. This results in the decrease in capacitance under such conditions.

Mathematically, equation (1) expresses the capacitance of a parallel plate as follow:

$$C = \varepsilon A / T \qquad (1)$$

In equation (1) $\varepsilon$, A and T are respectively the dielectric constant, area and thickness of a piezoelectric layer sandwiched between a common and an outer electrode. The application of a DC field opposite to the poled field will result in the contraction of the layer thickness T and expansion in the area A. Hence, the capacitance is expressed as per equation (2):

$$C_{\downarrow\uparrow} = \varepsilon (A + \Delta A)(T - \Delta T)^{-1} \qquad (2)$$

In equation (2) $C_{\downarrow\uparrow}$ signifies the capacitance when the electric field is applied opposite to the poled field and where $\Delta A$ and $\Delta T$ are the variations in area and thickness, respectively. Meanwhile, the application of a DC field parallel to the poled field will result in the contraction of the layer area A and expansion in the thickness T. Hence, the capacitance is expressed as per equation (3):

$$C_{\uparrow\uparrow} = \varepsilon (A - \Delta A)(T + \Delta T)^{-1} \qquad (3)$$

In equation (3) $C_{\uparrow\uparrow}$ signifies the capacitance when the electric field is applied parallel to the poled field. Dividing (2) over (3), yields:

$$C_r (T - \Delta T)(T + \Delta T)^{-1} = (A + \Delta A)(A - \Delta A)^{-1} \qquad (4)$$

In equation (4) $C_r = C_{\downarrow\uparrow} / C_{\uparrow\uparrow}$. Equation (4) connects the change in capacitance ratio $C_r$ with the change in dimensions due to the piezoelectric effect. Equation (4) may be simplified using the Taylor approximation $(1+x)^n = 1 + nx$, where $x \ll 1$. Therefore, when $\Delta T/T \ll 1$ and when $\Delta A/A \ll 1$, applying the Taylor approximation to equation (4) yields:

$$C_r (1 - 2\Delta T/T) = (1 + 2\Delta A/A) \qquad (5)$$

Equation (5) correlates changes in capacitance ratio $C_r$ to both changes in thickness T and area A, assuming T or A are not zero.

In embodiments for manufacturing a piezoelectric material or structure as disclosed herein, a first layer of a piezoelectric material and a second layer of piezoelectric material are deposited on opposite sides of a substrate forming a common electrode. The deposition process is to lay down the piezoelectric material on the common electrode for example by sputtering or by spin coating. It is worth mentioning that the deposition process of both layers may end up with different thicknesses and dielectric constants, as they are deposited sequentially. To overcome such discrepancies, the variation in areas, thicknesses, and dielectric constants is expressed in terms of an applied electric field E, rather than the applied voltage. Doing this will allow the geometrical variations and change in dielectric constants to be normalized. The variation in thickness T and area A in terms of applied electric field (E) can be expressed as follow:

$$\pm \Delta T/T = \pm d_{33} E \qquad (6)$$

$$\pm \Delta A/A = \pm 2 d_{31} E + (d_{31} E)^2 \qquad (7)$$

In equations (6) and (7) $d_{33}$ and $d_{31}$ are the longitudinal and transversal piezoelectric voltage constants, respectively. Equation (6) provides that the variation in thickness exhibits a linear relationship with the applied field E. Equation (7) shows that the variation in area exhibits a quadratic relationship with the applied field E. Substituting equations (6) and (7) into (5), produces a relation expressed in the following equation (8):

$$C_r - 2 C_r d_{33} E = 1 + 4 d_{31} E + 2 (d_{31} E)^2 \qquad (8)$$

In bulk piezoceramic, it is assumed that the relative change in the material dimensions is the same in both horizontal and vertical directions. Under this assumption, the relationship between the longitudinal $d_{33}$ and transversal $d_{31}$ piezoelectric voltage constants is approximatively $d_{33} = 2 d_{31}$, This is a standard approximation accepted in the field. Using this assumption and rearranging equation (8) yields:

$$2 E^2 d_{31}^2 + (4 E C_r + 4 E) d_{31} + (1 - C_r) = 0 \qquad (9)$$

Solving equation (9) for $d_{31}$, yields:

$$d_{31} = (-(C_r + 1) \pm \sqrt{C_r^2 + 2.5 C_r + 0.5}) E^{-1} \qquad (10)$$

Equation (10) states that there are two possible solutions. However, the negative value solution has been eliminated because the final value based on the formulations should be positive (i.e., due to physical limitations). Also, it should be noted that if the materials exhibit no piezoelectric effect, then $C_r$ is equal to 1 and $d_{31}$ is equal to zero. When applying these physical limitations, equation (10) is balanced only when the solution to $d_{31}$ reads as following equation (11):

$$d_{31} = (-(C_r + 1) + \sqrt{C_r^2 + 2.5 C_r + 0.5}) E^{-1} \qquad (11)$$

The significance of equation (11) is that the equation may be used to determine $d_{31}$ without requiring any knowledge and information about the change in dielectric constant or any other variations. The only needed parameter is the thickness of the sputtered thin film of the piezoelectric layer or layers. Said differently, under the above-mentioned assumptions regarding the relationship between $d_{31}$ and $d_{33}$, the two parameters are calculated by knowing the applied voltage (and hence the electric field) to a piezoelectric sensor based on such a piezoelectric structure and the capacitance ratio between two scenarios where the DC electric field applied over the piezoelectric structure is in the same or opposite direction to the poling direction respectively. Hence for a given piezoelectric film, after having conducted a poling process wherein the dipoles of the piezoelectric material are subjected to a constant electric field to force the dipoles to align in a poling direction, the capacitances are measured and recorded corresponding to a selection of specific voltage values with negative and positive polarities. The electric field (E) and capacitance ratio ($C_r$) are then computed based on the measured and recorded capacitance and voltage values.

It is worth noting that the assumed approximated relation of $d_{33}=2d_{31}$, may be replaced by a more general one, specifically $d_{33}=xd_{31}$, where an approximation factor x may assume values between 1 and 3, for example to adjust the approximation to different circumstances, conditions or practical applications of embodiments. Furthermore, almost 95% of the published literature in PZT based piezoelectric materials have reported numerically values for $d_{33}$ and $d_{31}$ supporting the approximation $d_{33}=2d_{31}$ and the mentioned optional adjustments to this approximation. Adjustments to the approximation of the relation between $d_{33}$ and $d_{31}$ may be based on the fact that for PZT based materials, the domain structure of the grains in the material has a strong influence on the ratio $d_{33}/d_{31}$.

Sample Preparation

To demonstrate the current approach described in this disclosure, a non-limiting exemplary embodiment has been utilized. In the exemplary embodiment, a thin piezoelectric film is deposited on both sides of a steel sheet using the sputtering technique. The deposition conditions are listed in Table 1. The film post annealing process was done at 700° C. for one hour. The thickness of the employed steel flexible sheet is of 50 µm, and the thickness of the deposited piezoelectric layers on both steel sides was measured to be 2.41 µm.

FIG. 2 shows an illustration of a film shaped structure 200 with a stack of layers with a first and a second piezoelectric layers PZE1, PZE2 sandwiching a metallic sheet Shim 100 with poling directions (↓P). In FIG. 2 the stack of layers is composed with a thin metallic steel sheet that is coated from both sides with noble materials PLT/Pt/Ti as a seeding layer for the deposition of the piezoelectric thin film materials layers on both faces of the steel. As illustrated in FIG. 2, the shim layer 100 is a flexible steel sheet which acts as a common electrode. Furthermore, both outer surfaces of PZE1 and PZE2 are coated with Al metallization to form electrical contacts. The poling of piezoelectric material in the film structure has been conducted at room temperature with the application of 250 kV/cm applied for 20 minutes. The CV measurements are conducted between the metallic shim and the outer electrical electrodes.

TABLE 1

| PZT thin film deposition conditions | | | | |
|---|---|---|---|---|
|  | Ti | Pt | PLT | PZT |
| Deposition temp [° C.] | 500 | 500 | 650 | 700 |
| Sputtering Pressure [Pa] | 0.8 | 0.5 | 0.5 | 0.5 |
| RF power [W] | 80 | 100 | 150 | 90 |
| Ar/O$_2$ [sccm] | 20/0 | 20/0 | 19.5/0.5 | 19.5/0.5 |
| Deposition time [min] | 6 | 8 | 15 | 300 |

As illustrated in FIG. 2 poling directions are indicated by the arrows to the left in the drawing, with a first poling direction 102 for the first piezoelectric layer PZE1 forming a first outer electrode of the structure and a second poling direction 104 for the second piezoelectric layer PZE2 forming a second outer electrode of the structure. In this example, both layers have been poled in the same direction, hence for identically applied voltage polarities applied across them, the respective thicknesses of the piezoelectric layers PZE1 and PZE2 will either both increase or decrease simultaneously. Meanwhile, if the applied voltages polarities are opposite to each other, one layer will increase in thickness and the other layer thickness will decrease.

To assess the efficiency of the fabrication process, X-Ray Powder Diffraction (XRD) measurements have been conducted for the steel flexible sheet before PZT deposition, i.e. in the blank state, and for the flexible sheet with a PZT deposited over steel, i.e. in the coated state. FIG. 3 shows a graph representing XRD measurements of the fabricated PZT layer to assess the quality of for example such embodiments as described in connection with FIG. 2. In FIG. 3, the XRD measurements is represented in the graph such that the filled circles represent the diffraction peaks of steel flexible sheet, and the open circles represent the diffraction peaks of the PZT deposition layer on the flexible steel sheet. The existence of multiple peaks and the distribution of the peaks along the angle of orientation indicates that the PZT deposition quality is high and the sample does not have disordered materials.

Calibration Method

Figure 4:
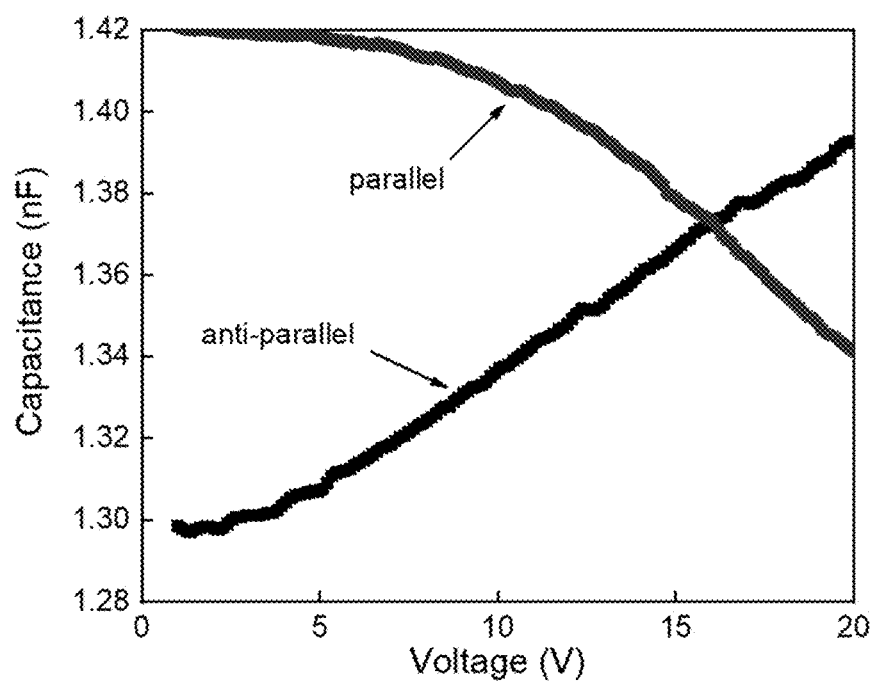
FIG. 4 shows measured CV of a bulk sample, in accordance with embodiments.

To further calibrate embodiment methods, CV measurements may be conducted over samples of piezoelectric material. FIG. 4 shows measured CV of a bulk sample, in accordance with embodiments. The graph in FIG. 4 represents the results using a calibration method comprising CV measurements on a piezoelectric PZT unclamped bulk ceramic with thickness 0.24 mm. The sample unclamped piezoelectric material is thus not attached to any other material, substrate or artefact. The graph depicts capacitance measurements for voltages applied over the sample, with a first direction of the biasing voltage in parallel with and a second direction antiparallel to the poling direction of the piezoelectric structure of the sample. The measured $d_{31}$ using Berlincourt meter is of 250 µm per volt of this unclamped sample. The extracted $d_{31}$ piezoelectric voltage constant using (11) yields 190 µm per volt. The current method is in this example corrected by multiplying (11) with a correction factor Corr that in this example is calculated and approximated to (4/3), to correct the discrepancy between measured and extracted values; hence equation (11) is modified as per equation (12). It should be noted that this correction factor depends on the structure and on the process used to make the piezoelectric. Therefore, such factor value may change if other known structures or processes known in the field are used. Equation (12) incorporates the correction factor Corr for calibration, where Corr is 4/3 in the following equation (12).

$$d_{31}=(4/3)(-(C_r(+1)+\sqrt{C_r^2+2.5C_r+0.5})E^{-1} \quad (12)$$

FURTHER METHOD EMBODIMENTS

Figure 5:
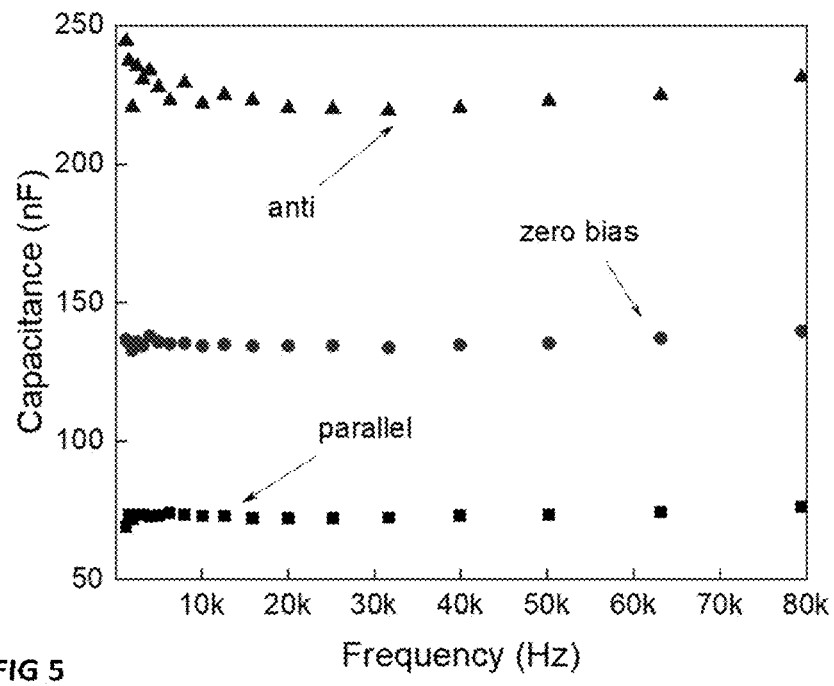
FIG. 5 shows capacitance versus frequency measurements for unbiased (at zero volts), anti (at +3 volt) and parallel biasing (at −3 volt), in accordance with embodiments.

In order to verify the results of the calibration method embodiments comprises reference measurements. FIG. 5 shows capacitance versus frequency measurements for an unbiased sample structure, i.e., at zero volts applied voltage, anti-parallel biasing at +3 volts applied voltage and parallel biasing at −3 volt applied voltage, in accordance with embodiments The electrical measurement was taken using a Gamry 3000 reference equipment. Capacitances versus frequency measurements at zero bias were conducted to determine the frequency range and its self-resonance frequency, shown in the middle data point series in the graph of FIG. 5. The capacitance shows a smooth response over the frequency as displayed by FIG. 5. The measurements were taken along frequency variations in the range of 1-80 kHz. Further, a dc voltage was applied to both layers for capacitance versus frequency at +3 volt dc rendering an anti-parallel bias (also called anti-polarization) as shown in the lower data point series in the graph, and at −3 volt dc voltage rendering a parallel bias (i.e., parallel to polarization) as shown in the upper data point series in the graph.

FIG. 5 shows that when the applied voltage is anti-parallel to the poling direction of the PZT material, the values of the measured capacitance increases with the frequency as it reaches around 230 nF. On the other hand, applying voltage parallel to the poling direction decreases the values of the measured capacitance slightly with the frequency and reaches around 75 nF. While in the zero-biasing case, the capacitance measurements stay nearly constant around the value 135 nF along the range of the frequency. As anticipated, the applied voltage in directions either parallel or opposite to the poling direction will cause a change in the dimension which is pronounced by the capacitance measurements. In the measurement example illustrated with FIG. 5, the two layers have been subjected to biasing voltages in opposite directions with constant dc voltage over frequency variation.

Figure 6:
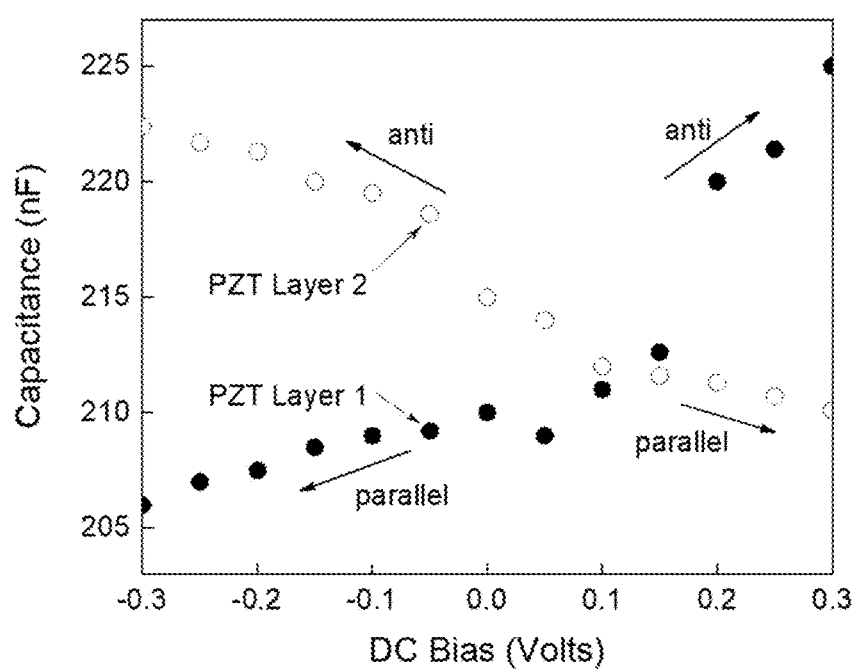
FIG. 6 shows simultaneous CV measurements of the two piezoelectric layers, in accordance with embodiments.

FIG. 6 shows the two piezoelectric capacitance voltage responses, i.e., for each of the two piezoelectric layers, when the applied voltage has been swept from −0.3 to +0.3 volts. For layer 1, represented by data points indicated by filled circles in the graph of FIG. 6, the capacitance increase for the positive applied field as it is driven opposite to the poling field direction, meanwhile it decreases for the negative values as it is driven parallel to the to the poling field direction. On the contrary, for layer 2, represented by data points indicated by open circles in the graph of FIG. 6, the capacitance increases for negative applied field as it is driven parallel to the poling field direction, meanwhile it decreases for positive values as it is driven opposite to the to the poling field direction.

Figure 7:
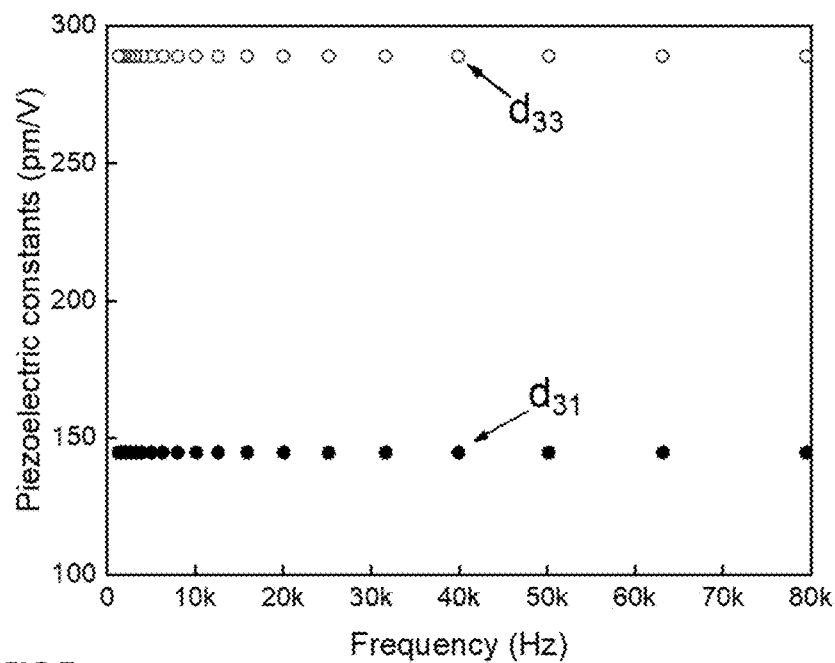
FIG. 7 shows extracted piezoelectric voltage constants in accordance with embodiments using equation (12).

In embodiments, the piezoelectric voltage constants $d_{31}$ and $d_{33}$ are extracted and estimated using equation (12) and the data or similar data as presented in FIG. 5. Examples of the extracted $d_{31}$ and $d_{33}$ piezoelectric voltage constants have been estimated and depicted in relation to frequency in a graph in FIG. 7, with the values for constant $d_{31}$ is indicated with filled circles and values for the constant $d_{33}$ is indicated with open circles. In this exemplifying instance, the piezoelectric structure has been subjected to an applied electric field of 1.25 volt per μm. As observed from FIG. 7, the constants exhibit a smooth behavior over the wide frequency range. For example, at a frequency of 40 kHz, the $d_{33}$ and $d_{31}$ constants read 284 and 142 pm per volt, respectively. These values are comparable with values that have been determined with other, previously known, methods as reported in published related art literature for the same or similar thin film thickness.

Figure 8:
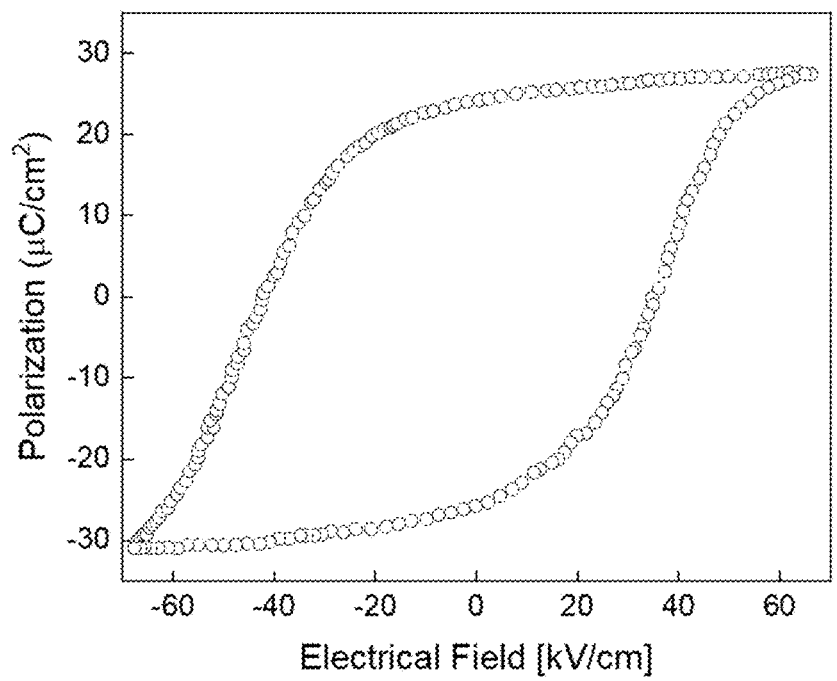
FIG. 8 shows polarization curve for a piezoelectric structure with films of piezoelectric material deposited on steel sheet, in accordance with embodiments.

Equation (12) along with CV measurements presented in FIG. 6 have been used to extract the piezoelectric constants of both layer 1 PZE1 and layer 2 PZE2 of the stack according to the embodiment shown in FIG. 2. The estimated mean values of values for $d_{31}$ of layer 1 PZE1 and layer 2 PZE2 are in this embodiment 125 and 130 μm per volt, respectively. Furthermore, the variation in the capacitance of structures incorporating piezoelectric materials, due to the applied voltage can be generated either by determining the dielectric constant voltage dependency and/or or by determining the expansion/contraction in the dimensions of the poled material. FIG. 8 shows a graph illustrating the dielectric constant voltage dependency as a polarization curve for a piezoelectric structure with films of piezoelectric material deposited on steel sheet, in accordance with embodiments as shown in FIG. 2. The values according to the graph in FIG. 8 reveals that the change in the polarization due to the change in electric field is equal to 1.6 C/cm². Hence the equivalent capacitance change from this change in polarization is of 0.6 pF. Therefore, 1% of the measured capacitance change is due to dielectric constant voltage dependency while 99% of this change is referred to the variations of sample dimensions due to the piezoelectric effect. Another piezoelectric constant called e31,f can be correlated with the piezoelectric constant $d_{33}$ may be measured with other setups of measurement, and in the context of FIG. 8 the piezoelectric constant (e31,f) is then estimated to be −3.8 C/m². The dielectric constant of the film is computed to be of 240 on average.

Embodiments for Direct Extraction of $d_{33}$ and $d_{31}$ from Cr-E

It is also possible to extract simultaneously the $d_{31}$ and $d_{33}$ piezoelectric constants directly from (8). It should be noted that this section does not rely on the assumption that $d_{33}$=2 $d_{31}$ as in above described embodiments. Equations (8) could be arranged to express the capacitance ratio (Cr) as a function of applied voltage, wherein the applied voltage is expressed in the equation in terms of electric field E, as per equation (13):

$$C_r=(1+4d_{31}E+2(d_{31}E)^2)(1-2d_{33}E)^{-1} \quad (13)$$

Assuming that $2d_{33}E \ll 1$, the Taylor approximation $(1+x)^n=1+nx$, may be applied to equation (13) to yield:

$$C_r=(1+4d_{31}E+2(d_{31}E)^2)(1+2d_{33}E) \quad (14)$$

Equation (14) could be further simplified as follows in equation (15):

$$C_r=1+2(d_{33}+2d_{31})E+2(4d_{31}d_{33}+d_{31}d_{31})E^2+4d_{31}^2d_{33}E^3 \quad (15)$$

The last cubic term of equation (15) can be neglected, due to its very small value. As such, equation (15) may be expressed as follows in equation (16):

$$C_r=1+2(d_{33}+2d_{31})E+2(4d_{31}d_{33}+d_{31}d_{31})E^2 \quad (16)$$

Figure 9A:
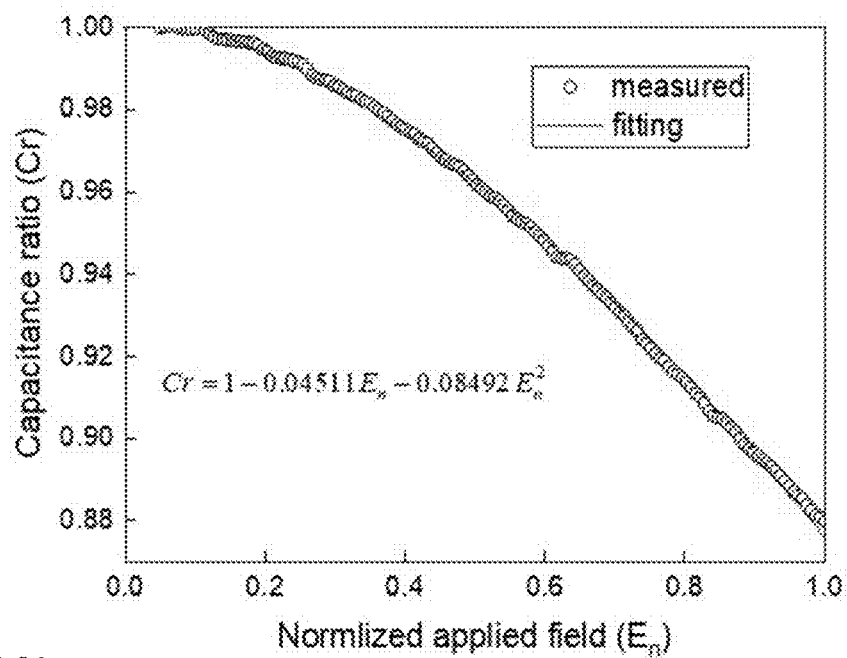
FIGS. 9A and 9B show extracted normalized capacitance ratio (Cr) values versus normalized applied electric field ($E_n$) voltage along with their corresponding fitting curves, in accordance with embodiments using bulk sample used for calibration (FIG. 9A) and thin film structure under study (FIG. 9B).
Figure 9B:
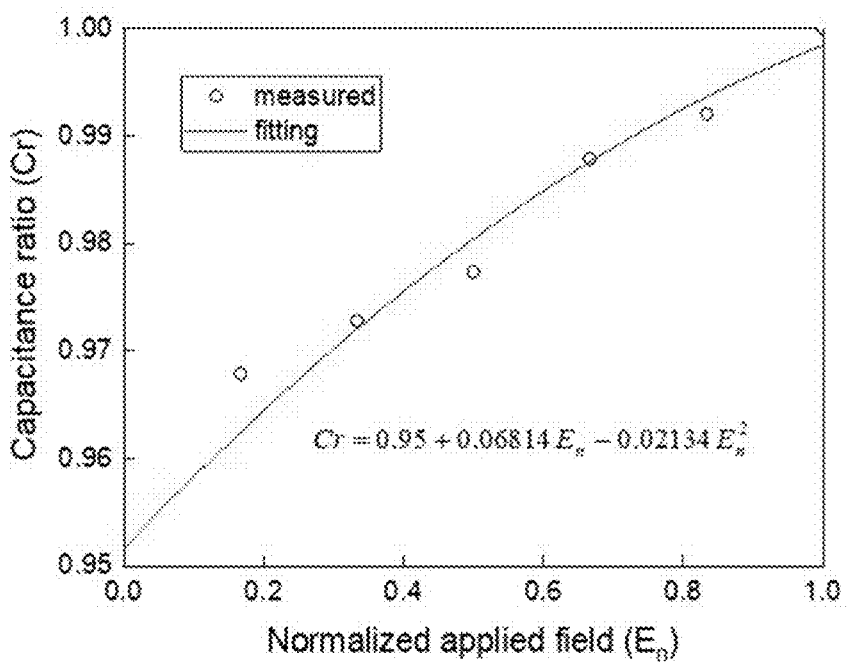

Equation (16) indicates that $d_{31}$ and $d_{33}$ can be extracted simultaneously by fitting the measured Cr values versus E using quadratic fitting. For calibration purposes, a piezoelectric bulk ceramic material of thickness 0.150 mm with $d_{33}$ and $d_{31}$ of 430 and 230 μm per volts, respectively, has been utilized in embodiments. Nevertheless, as both the calibration sample and sample under test have different thicknesses of more than three order of magnitudes, the normalized applied electric field may be used in embodiments to account for this difference. FIGS. 9A and 9B show graphs that display the measured capacitance ratio (Cr) values versus the normalized applied electric field (En) voltage for the bulk and thin film samples, respectively. The fitting equation of the extracted capacitance ratio versus the normalized applied electric field for the bulk sample is found to be in accordance with equation (17):

$$C_r = 1 - 0.04511 E_n - 0.08492 E_n^2 \quad (17)$$

Comparing equation (17) with equation (16), the second and the third terms account for the piezoelectric effect. Hence equations (18 and (19):

$$2(d_{33} + 2d_{31}) = -0.04511 \quad (18)$$

$$2(4d_{31}d_{33} + d_{31}d_{31}) = -0.0849 \quad (19)$$

Solving equations (18) and (19) simultaneously for $d_{31}$ and $d_{33}$ yields 0.0846 pC/N and 0.1666 pC/N, respectively. Hence for calibration the solution for equations (18) and (19) should be multiplied by a factor of 2945 to calibrate the method. This number considers the normalization of electric field and the method calibration. For the electric field normalization consideration, it is required to multiply back by the maximum applied field (V/T) max; voltage over thickness=20/(0.12e−3)=166,666.666. Multiplying (0.0846) by this maximum field yields 14,100. This value now should be compared with the Berlincourt value 250. Therefore, for the calibration of method and computation the 14,100 should be multiplied by 0.0177; hence this number, i.e., "factor number "2945", is the result of the multiplication of (166,666.666*0.0177)="2945".

Therefore, the actual $d_{33}$ and $d_{31}$ reads 448 pC/N and 228 pC/N, respectively, i.e., $d_{33}$ is equal to 1.96 times $d_{31}$ (approximately $d_{33} \approx 2d_{31}$). For the film under study, the corresponding fitting equation is found to be in accordance with the following equation (20):

$$C_r = 0.95 + 0.06814 E_n - 0.02134 E_n^2 \quad (20)$$

Solving the mathematical model generated by comparing equation (20) to equation (16) and incorporating the calibration step yields $d_{33}$ and $d_{31}$ of 134 pC/N and 256 pC/N, respectively. It is noted that the direct extraction method using the Cr-E approach produces a maximum error of 5%.
Embodiments for Direct Extraction of $d_{33}$ and $d_{31}$ from Fr-E Incorporating a piezoelectric material in a resonator structure that has a measurable resonance frequency, with the possibility to drive this resonator against and along polarization/poling directions, the resonance frequency may be written as the following equation (17-1):

$$f = \frac{1}{2\pi \sqrt{LC}} \quad (17\text{-}1)$$

In equation (17-1) f is the resonance frequency, C is the capacitance and L is the effective inductor of the resonator, which will not change with driving the piezoelectric against or along the poling field.

The frequency ratio fr between the resonance frequency along the polarization over the resonance frequency measured when driving against the poling is in accordance with the following equation (18-1):

$$f_r = \frac{1}{2\pi \sqrt{LC_p}} \Big/ \frac{1}{2\pi \sqrt{LC_a}} \quad (18\text{-}1)$$

The above expression may be simplified to yield an fr in accordance with the following equation (19-1):

$$f_r = \sqrt{\frac{C_a}{C_p}} \quad (19\text{-}1)$$

However, as described above, the ratio of the capacitance when the electrical field is opposite the poling direction and is parallel to the poling direction is expressed as Cr. Therefore, the above expression may be simplified to yield the fr in accordance with the following equation (20-1):

$$f_r = C_r \quad (20\text{-}1)$$

Substituting the expression from Cr, as provided in equation (20B), using equation (49 yields:

$$C_r(T - \Delta T)(T + \Delta T)^{-1} = (A + \Delta A)(A - \Delta A)^{-1} \quad (4)$$

$$C_r = (A + \Delta A)(A - \Delta A)^{-1} / (T - \Delta T)(T + \Delta T)^{-1} \quad (4)$$

$$C_r = (A + \Delta A)(A + \Delta A)(T + \Delta T)(T + \Delta T) \quad (4)$$

$$C_r = AATT(1 + \Delta A/A)(1 + \Delta A/A)(1 + \Delta T/T)(1 + \Delta T/T) \quad (420\text{B-}4)$$

$$C_r = AATT(1 + \Delta A/A)(1 + \Delta A/A)(1 + \Delta T/T)(1 + \Delta T/T) \quad (20\text{B})$$

This results in fr in accordance with the following equation (21):

$$f_r = AT\left(1 + \frac{\Delta A}{A}\right)\left(1 + \frac{\Delta T}{T}\right) \quad (21)$$

Therefore, the absolute value of the normalized frequency ratio frn is in accordance with the following equation (22):

$$f_{rn} = \left(1 + \frac{\Delta A}{A}\right)\left(1 + \frac{\Delta T}{T}\right) \quad (22)$$

It should be note that Normalization is done based on the volume of the piezoelectric layer at zero bias in order to simplify the calculation and mathematical derivations. So, equation (22) produces the following equation (23) for the normalized frequency ratio frn:

$$f_{rn} = (1 + 2d_{31}E + (d_{31}E)^2)(1 + d_{33}E) \quad (23)$$

And therefore the normalized frequency ration frn is in accordance with the following equation (24):

$$f_{rn} = 1 + (2d_{31} + d_{33})E + (2d_{31}d_{33} + d_{31}^2)E^2 + d_{31}^2 d_{33} E^3 \quad (24)$$

Thus, by fitting the normalized frequency ratio frn versus applied electric field E with cubic equation, the coefficient d31 and d33 can be extracted, in accordance with embodiments.

Therefore, the characterization of piezoelectric constants relevant to a specific application will enhance their use. This disclosure describes several embodiments of methodologies and structures that may be used to determine the piezoelectric constants. The piezoelectric material should be incorporated as a capacitance dielectric material in the shape of a film. An electric applied field is then applied to drive the film parallel and anti-parallel to the poling field direction. This is usually done by sweeping the voltage from negative to positive values. The variations in geometric dimensions and the corresponding dielectric constant of the materials due to the applied field will be reflected in the measured capacitance. The developed models require only the pre-knowledge of the film thickness and automatically de-embed the change in dielectric constant due to the applied stress. The embodiment methods have been calibrated using unclamped bulk PZT ceramic and validated using conventional meters. The estimated and measured values are well corroborated with each other. The techniques in accordance with embodiments herein do not require any sample heavy preparation steps and provide a rapid response along with accurate estimations.

The invention claimed is:

1. A method for determining piezoelectric parameters of a piezoelectric structure comprising:
applying a voltage to thereby applying a biasing electrical field E over the piezoelectric structure, where the applied voltage is adapted so that the biasing electrical field has one or more selected directions in relation to a poling direction P of said piezoelectric structure including at least one of the same and the opposite direction to the poling direction P to force the dipoles to align in a poling direction;
determining the longitudinal piezoelectric voltage constant $d_{33}$ and transversal piezoelectric voltage constant $d_{31}$ of said piezoelectric structure in relation to a predetermined parameter ratio solely by knowing the applied electrical field E and the thickness of the piezoelectric layers without requiring any knowledge and information about the change in dielectric constant, wherein the piezoelectric structure is a thin film piezoelectric structure including a first piezoelectric layer having a first thickness and constituting a first outer electrode and a second piezoelectric layer having a second thickness and constituting a second outer electrode, and wherein determining of the piezoelectric parameters of the piezoelectric structure is further comprising:
incorporating the piezoelectric structure in a resonator structure having a measurable resonance frequency f and an effective inductor L;
driving the resonator against and along polarization/poling directions;
measuring the resonance frequency f for a selection of values for the applied electric field E and wherein the predetermined parameter ratio is a capacitance ratio $Cr = C\downarrow\uparrow / C\uparrow\uparrow$ based on the quota between a first capacitance $C\downarrow\uparrow$ of the piezoelectric structure due to an applied biasing electrical field with a direction antiparallel to said poling direction and a second capacitance $C\uparrow\uparrow$ of the piezoelectric structure due to an applied biasing electrical field with a direction parallel with said poling direction; and
determining the piezoelectric voltage constants $d_{33}$ and $d_{31}$ based on the relation with a normalized frequency ratio $f_{rn}$ as a function of applied voltage, wherein the applied voltage is expressed in terms of electric field E, according to the following equation (24)

$$f_{rn} = 1 + (2d_{31} + d_{33})E + (2d_{31}d_{33} + d_{31}^2)E^2 + d_{31}^2 d_{33} E^3$$

and by fitting values for the normalized frequency ratio $f_{rn}$ versus values of the applied electric field E using a fitting method, wherein the fitting method is a cubic equation fitting or a quadratic equation fitting.

2. The method for determining piezoelectric parameters of a piezoelectric structure in accordance with claim 1, wherein:
the relation between the piezoelectric voltage constants $d_{33}$ and $d_{31}$ is determined based on the relation according to the following equation (8)

$$C_r - 2C_r d_{33} E = 1 + 4d_{31} E + 2(d_{31} E)^2$$

3. The method for determining piezoelectric parameters of a piezoelectric structure in accordance with claim 2, wherein:
the piezoelectric voltage constant $d_{31}$ is determined based on the relation according to the following equation (11)

$$d_{31} = (-(C_r + 1) + \sqrt{C_r^2 + 2.5 C_r + 0.5}) E^{-1}.$$

4. The method for determining piezoelectric parameters of a piezoelectric structure in accordance with claim 3, further comprising:
applying a said biasing electric field E with a selection of voltage values with negative and positive polarities over the piezoelectric structure;
measuring capacitance values for said voltage values;
calculating the electric field E and the capacitance ratio $C_r$ based on said capacitance values, said voltage values and a value for the thickness T of a piezoelectric layer of the piezoelectric structure.

5. A method for determining piezoelectric parameters of a piezoelectric structure in accordance with claim 1, further comprising calibrating the relation between the piezoelectric voltage constant $d_{31}$ and the capacitance ratio Cr by:
determining, for an unclamped piezoelectric material used in the piezoelectric structure, a first value for the piezoelectric voltage constant $d_{31}$ with a first method based on the relation according to the following equation $$d_{31} = (-(C_r + 1) + \sqrt{C_r^2 + 2.5 C_r + 0.5}) E^{-1} \qquad (11)$$

and a second value for the piezoelectric voltage constant $d_{31}$ with a second method, for example based on measurement by means of a Berlincourt meter;
determining a correction factor Corr for the relation between the piezoelectric voltage constant $d_{31}$ and the capacitance ratio Cr based on the quota between said second value and said first value for the piezoelectric voltage constant $d_{31}$;
applying said correction factor such that piezoelectric voltage constant $d_{31}$ is determined based on the relation according to the following equation (12B)

$$d_{31} = \text{Corr}(-(C_r + 1) + \sqrt{C_r^2 + 2.5 C_r + 0.5}) E^{-1}.$$

6. The method for determining piezoelectric parameters of a piezoelectric structure in accordance with claim 1, wherein:
the piezoelectric voltage constant $d_{33}$ is determined as $d_{33} = x d_{31}$, where an approximation factor x may assume values between 1 and 3, preferably x=2 such that $d_{33} = 2 d_{31}$.

7. The method for determining piezoelectric parameters of a piezoelectric structure in accordance with claim 1, comprising:
measuring $C_r$ values for a selection of said applied voltage values;
determining the piezoelectric voltage constants $d_{33}$ and $d_{31}$ based on the relation with the capacitance ratio Cr as a function of applied voltage, wherein the applied voltage is expressed in terms of electric field E, according to the following equation $$C_r = (1 + 4d_{31}E + 2(d_{31}E)^2)(1 - 2d_{33}E)^{-1} \quad (13)$$

and by fitting the measured values for $C_r$ for specific voltage values using a fitting method, preferably quadratic fitting.

8. The method for determining piezoelectric parameters of a piezoelectric structure in accordance with claim 1, wherein the second piezoelectric layer constituting the second outer electrode on a metallic sheet (Shim) constituting a common electrode sandwiched between said first and second electrodes.

* * * * *